United States Patent
Green et al.

(10) Patent No.: US 6,229,310 B1
(45) Date of Patent: May 8, 2001

(54) MAGNETIC RESONANCE IMAGING EXCITATION AND RECEPTION METHODS AND APPARATUS

(75) Inventors: Charles Green, Holbrook; Jan Votruba, Ridge; Gregory Eydelman, West Hempstead; Raymond V. Damadian, Woodbury, all of NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/288,722

(22) Filed: Apr. 9, 1999

Related U.S. Application Data

(62) Division of application No. 08/683,623, filed on Jul. 17, 1996, now Pat. No. 5,939,883.

(51) Int. Cl.[7] .................................................... G01V 3/00
(52) U.S. Cl. ........................................... 324/318; 324/322
(58) Field of Search ................................. 324/322, 318, 324/314, 309, 307, 319

(56) References Cited

U.S. PATENT DOCUMENTS

| | | | |
|---|---|---|---|
| 4,310,799 | * 1/1982 | Hutchinson et al. | 324/319 |
| 4,691,163 | 9/1987 | Blass et al. | 324/318 |
| 4,737,712 | 4/1988 | Stormont et al. | 324/322 |
| 4,829,252 | 5/1989 | Kaufman | 324/309 |
| 4,875,485 | 10/1989 | Matsutani | 324/307 |
| 4,882,560 | * 11/1989 | Young et al. | 335/299 |
| 4,920,318 | 4/1990 | Misic et al. | 324/318 |
| 4,968,937 | 11/1990 | Akgun | 324/318 |
| 5,024,229 | 6/1991 | Bryant et al. | 324/318 |
| 5,050,605 | 9/1991 | Eydelman et al. | 324/318 |
| 5,065,760 | 11/1991 | Krause et al. | 128/653.5 |
| 5,144,241 | * 9/1992 | Oppelt et al. | 324/318 |
| 5,177,443 | 1/1993 | Gilderdale | 324/318 |
| 5,207,224 | * 5/1993 | Dickinson et al. | 128/653.5 |
| 5,243,289 | 9/1993 | Blum et al. | 324/318 |
| 5,245,286 | 9/1993 | Carlson et al. | 324/319 |
| 5,304,932 | 4/1994 | Carlson | 324/318 |
| 5,365,173 | 11/1994 | Zou et al. | 324/322 |
| 5,378,988 | 1/1995 | Pulyer | 324/318 |
| 5,473,252 | 12/1995 | Renz et al. | 324/322 |
| 5,490,513 | 2/1996 | Damadian et al. | 128/653.2 |
| 5,663,645 | * 9/1997 | Kaufman et al. | 324/318 |
| 5,903,150 | * 5/1999 | Roznitsky | 324/318 |

OTHER PUBLICATIONS

Hitachi Medical Systems of America, Inc. Catalogue.
Abstract of U.S. Patent 5,241,272—Circularly polarizing local antenna for a nuclear magnetic resonance imaging apparatus.
Abstract of U.S. Patent 5,035,231—Endoscope Apparatus.
Abstract of U.S. Patent—4,672,972—Solid State NMR Probe.
Abstract of U.S. Patent 5,435,302—Flexible Surface Coils for Use in Nuclear Magnetic Resonance Imaging.
Abstract of U.S. Patent 5,462,055—MRI Hyperthermia Dual Function Antenna System.
Abstract of U.S. Patent 5,303,707—Magnetic Resonance Methods and Apparatus.
Abstract of U.S. Patent 5,361,764—Magnetic Resonance Imaging Foot Coil Assembly.
Abstract of U.S. Patent 5,280,249—Circularly Polarizing Local Antenna for a Nuclear Magnetic Resonance Apparatus.

* cited by examiner

Primary Examiner—Louis Arana
(74) Attorney, Agent, or Firm—Lerner, David, Littenberg, Krumholtz & Mentlik, LLP

(57) ABSTRACT

In magnetic resonance imaging ("MRI"), RF power is applied to a region of interest within the patient by a local antenna disposed adjacent the region of interest. The local antenna is excited by RF signals sent through free space from a principal antenna mounted to the primary field magnet of the MRI system. The principal antenna includes one or more loops mounted so that the plane of the loop is transverse to the pole pieces of the magnet frame and so that the plane of the loop is transverse to adjacent metallic portions of the frame. The loops are aligned with openings in the frame so that a patient is advanced into a frame through the loop. The loops do not substantially obstruct axis to the subject receiving space.

32 Claims, 7 Drawing Sheets

MAGNETIC RESONANCE IMAGING EXCITATION AND RECEPTION METHODS AND APPARATUS

CROSS-REFERENCE TO RELATED APPLICATIONS

The present application is a divisional of U.S. Pat. application Ser. No. 08/683,623, filed Jul. 17, 1996, now U.S. Pat. No. 5,939,883 the disclosure of which is incorporated by reference herein.

BACKGROUND OF THE INVENTION

The present invention relates to the field of magnetic resonance imaging or "MRI".

MRI is widely used in medical and other arts to obtain images of a subject such as a medical patient. The patient's body is placed within the subject-receiving space a primary field magnet and exposed to a strong, substantially constant primary magnetic field. Powerful radio frequency ("RF") signals are broadcast into the subject receiving space to excite atomic nuclei within the patient's body into nuclear magnetic resonance, so that the nuclei spin around axes aligned with the magnetic field. The spinning nuclei generate minuscule RF signals, referred to herein as magnetic resonance signals. By applying magnetic field gradients so that the magnitude of the magnetic field varies with location inside the subject-receiving space, the magnetic resonance phenomenon can be limited to only a particular region or "slice" over the patient's body, so that all of the magnetic resonance signals come from that slice. Moreover, by applying such magnetic field gradients, characteristics of the magnetic resonance signals from different locations within the slice, such as the frequency and phase of the signals can be made to vary in a predictable manner depending upon position within the slice. Stated another way, the magnetic resonance signals are "spatially encoded" so that it is possible to distinguish between signals from different parts of a slice. After performing many excitations under different gradients, it is possible to derive a map showing the intensity or other characteristics of magnetic resonance signals versus position within the slice. Because these characteristics vary with the concentration of different chemical substances and other chemical characteristics of the tissue, different tissues provide different magnetic resonance signal characteristics. When the map of magnetic resonance signal characteristics is displayed in a visual format, such as on a computer screen or printed image the map forms a picture of the structures within the patient's body, with different tissues having different intensities or colors.

The RF excitation signals are normally applied by antennas fixed to the primary field magnet structure and arranged to provide substantially uniform excitation throughout the subject-receiving space. The RF excitation signals are provided by powerful radio transmitters. The magnetic resonance signals, which are many millions of times weaker than the RF excitation signals, can be received by antennas mounted on the primary field magnet or, more commonly, by antennas placed close to the area of the patient's body to be imaged. For example, where the patient's head is to be imaged, a loop-like coil antenna can be placed around the patient's head for reception of the magnetic resonance signals. Typically, these antennas are provided with flexible cables and connectors for attaching them to RF amplification and receiving devices incorporated in the MRI apparatus. The closely spaced RF receiving antenna provides efficient electromagnetic coupling between the antenna and the region of interest within the patient's body and thus provides efficient reception of the weak RF response signals.

By contrast, the magnet-mounted transmitting antennas normally do not provide efficient coupling to the areas of interest. That is, substantial parts of the RF power applied through such antennas are directed to regions of the patient's body other than the area of interest, and to regions of the subject-receiving space not occupied by the patient's body. To provide the desired RF excitation signal intensity within the region of interest, very strong RF signals must be applied through the transmitting antennas. This, in turn, requires expensive, powerful RF transmitters. Various proposals have been advanced to use localized antennas, similar to the antennas used for receiving the response signals, as transmitting antennas. If the RF excitation signal is applied through a localized transmitting antenna, with good coupling to the region of interest within the patient's body, the same RF field strength within the region of interest can be achieved with substantially less RF power from the transmitter. However, these proposals suffer from considerable practical difficulties. Even at the reduced power levels required, a heavy duty, well-grounded cable and connection are required to link the local antenna to the transmitter. The cables and connections are cumbersome, particularly where the antenna must be supported on the patient's body. Moreover, different transmitter coils typically are required for different regions of interest. Thus, the localized antennas must be repeatedly connected and disconnected from the transmitter during operation of the apparatus. This is burdensome to the operator because it is difficult and time consuming to connect and disconnect the heavy duty RF signal cables required for the excitation signals. Accordingly, there have been needs for MRI imaging methods and apparatus which provide better coupling of the transmitted RF signal to a region of interest, without the disadvantages associated with previous attempts to use local RF transmitting antennas.

Another difficulty encountered with conventional RF transmitting antennas mounted on the primary field magnet relates to the electrical interaction between the antenna and the remaining structure of the magnet. Typically, RF transmitting antennas have been provided as coils arranged in a plane, with the plane of the coil closely overlying a part of the magnet structure, most typically the pole piece of the magnet. To conserve room within the subject receiving space and leave a large open area for the patient, it is desirable to place the coil as close as possible to the magnet structure. However, the transmitting antenna and the magnet structure cooperatively act as a capacitor. When the transmitting antenna is arranged in close proximity to the magnet structure, a so-called "parasitic capacitance" is introduced into the electrical circuit of the transmitting antenna. This, in turn, causes problems in tuning the antenna. To provide efficient RF signal propagation, the resonant frequency of the transmitting antenna circuit must be equal to the frequency of the RF excitation signals to be sent and hence, must be equal to the resonant frequency of the atomic nuclei. The resonant frequency of the antenna circuit is inversely related to the inductance and the capacitance present in the circuit as a whole. The antenna has electromagnetic inductance. Preferably, the parasitic capacitance of the antenna together with the inductance of the antenna provide an untuned resonant frequency higher than the desired resonant frequency to match the RF excitation frequency. It is a simple matter to connect an additional capacitor into the transmitting antenna circuit so as to reduce its resonant frequency and thereby match the resonant frequency of the antenna circuit to the RF excitation frequency. However, where the parasitic capacitance and the natural inductance of the antenna, without any added capacitance, yield a resonant frequency below the RF excitation frequency, the antenna circuit cannot be tuned to the RF excitation frequency.

There has been a need for an RF transmitting antenna and transmitting antenna mounting structure which minimizes parasitic capacitance between the antenna and the magnet structure, which does not impair the other required characteristics of a transmitting antenna, and which also does not obstruct the subject receiving space to a substantial degree. This need has become progressively more acute. Higher magnetic field strengths generally yield better image qualities. Accordingly, MRI instrument designers have sought to use higher magnetic field strengths, above about 0.3 T and typically about 0.6 T. However, the resonant frequency of atomic nuclei and the required RF excitation frequency are directly related to the strength of the primary magnetic field. As the RF excitation frequency increases, the requirements for parasitic capacitance become progressively more stringent.

SUMMARY OF THE INVENTION

The present invention, in its various aspects, addresses the foregoing needs.

One aspect of the present invention provides methods of eliciting magnetic resonance signals from a subject. Methods according to this aspect of the invention desirably include the steps of positioning the subject in a subject receiving space of a magnetic resonance apparatus and exposing the subject to a magnetic field within the space, and providing a local antenna circuit including a local antenna disposed adjacent the subject within the subject receiving space. The method further includes the step of transmitting RF principal excitation signals by free-space transmission from a principal antenna disposed remote from the subject so that the principal RF excitation signals drive the local antenna circuit and so that the local antenna radiates local RF excitation signals into the subject. The RF excitation signals reaching the subject drive nuclei in the subject into nuclear magnetic resonance. The method further includes the step of receiving the magnetic resonance signals from the subject. In MRI imaging applications of the method, the transmitting and receiving steps are repeated cyclically and the resonance signals from the subject are spatially encoded.

The principal antenna may be mounted within or outside the subject receiving space, and typically is mounted on the primary field magnet assembly. The local antenna may be supported on the body of the subject, or may be mounted to a subject carrier such as a patient-receiving bed for movement into and out of the subject-receiving space with the subject. Alternatively, the local antenna may be mounted on the primary field magnet but at a location close to the location occupied by the subject during the MRI procedure. At least part of power radiated by the principal antenna into the subject receiving space is coupled into the local antenna circuit by free-space transmission from the principal antenna to the local antenna circuit and coupled from the local antenna circuit into the region of interest within the patient by transmission from the local antenna. The local antenna circuit serves to concentrate the RF power in the region of interest. Preferably, a substantial portion of the RF power from the principal antenna is coupled into the local antenna circuit.

The step of transmitting the principal RF excitation signals from the principal antenna to the local antenna circuit may include the step of receiving the principal excitation signals at the local antenna. Thus, the electromagnetic coupling between the local antenna circuit and the principal antenna is effected by coupling between the principal antenna and the same local antenna which serves to radiate the local RF excitation signals into the subject. Preferably, a substantial portion of the RF excitation signal transmitted to the subject are transmitted by way of the local antenna circuit and local antenna. Thus, although some of the principal RF excitation signals will also reach the subject, the local RF excitation signals impinging on the subject desirably have a magnitude at least equal to the magnitude of any principal RF excitation signals transmitted to the subject. The system provides efficient coupling to a region of interest within the subject in much the same manner as a wired local transmitting antenna, but without the difficulties associated with the heavy duty, high powered cable and connectors.

The same local antenna used in the transmission step may also be used to receive the resonant signals from the subject. To protect the RF receiver during the transmission step, the local antenna may be connected to a receiver during the receiving step and disconnected from the receiver during the transmission step, as by means of a switch connected between the local antenna circuit and the receiver.

A further aspect of the present invention provides magnetic resonance apparatus. Apparatus according to this aspect of the invention includes a frame defining a subject receiving space and one or more magnets for providing a magnetic field within such space as well as a local antenna circuit including local antenna and means for mounting the local antenna within the subject receiving space. The apparatus further includes a principal antenna mounted to the magnet frame and a transmitter for applying principal RF excitation signals to the principal antenna so that the principal antenna radiates the principal RF excitation signals to thereby drive the local antenna circuit. As described above in connection with the method, local RF excitation signals will be emitted through the local antenna and will drive the atomic nuclei of the subject into nuclear magnetic resonance so that the subject will emit resonance signals. The apparatus also includes a receiver for receiving these resonant signals from the subject. The local antenna mounting means may include means for physically mounting the local antenna on a subject, or on a subject carrier such as a bed used to move the subject into and out of the subject receiving space, so that the local antenna will be disposed within the subject receiving space when the subject is received in such space. The local antenna may be adapted to encircle a region of the subject.

Where the receiver is adapted to receive the magnetic resonance signals through the local antenna, the receiver is connected to the local antenna, desirably through a switch adapted to disconnect the receiver from the local antenna circuit during operation of the transmitter. Alternatively, the apparatus may include a receiver antenna separate from the local antenna and unconnected to the local antenna circuit and the receiver may be connected to the receiver antenna. The receiver antenna may be physically mounted to the local antenna so that both the receiver antenna and the local antenna can be positioned on the subject by the same device.

Apparatus according to further aspects of the invention provides magnetic resonance imaging apparatus including a frame defining a first pole having a first pole surface and a subject receiving space adjacent to first pole as well as a source of magnetic flux associated with the frame for directing flux through the first pole to the subject receiving space. The apparatus includes a first loop coil mounted to the frame adjacent the subject receiving space on a first side thereof. The first loop coil has a winding defining a first coil surface substantially transverse to the first pole surface. As further defined below, the term "coil surface" refers to an imaginary surface defined by the central axes of the conductors constituting a coil or antenna. For example, in the particular case of a flat, loop-like coil lying in a plane, the coil surface is the plane of the coil. Other, more complex coil shapes may define curved coil surfaces. A transmitter is connected to the first loop coil for transmission of RF excitation signals into the subject receiving space, with the first loop coil acting as all or part of the transmitter antenna.

Where the apparatus is intended as a whole body scanner, the windings of the first loop coil encircle a coil bore preferably having a smallest dimension of at least about 28 cm and more preferably at least about 35 cm, so that a subject, such as a human patient can be introduced into the subject receiving space through the coil bore. The apparatus preferably also includes a second loop coil mounted to the frame also adjacent to subject receiving space but on a second side thereof opposite from the first side. The second loop coil has a winding defining a second coil surface transverse to the first pole surface. Typically, the frame also defines a second pole having a second pole surface, the first and second poles being disposed on opposite sides of the subject receiving space so that the subject receiving space lies between the poles. Most preferably, the coil surface defined by each loop coil is substantially transverse to all surfaces of the magnet disposed adjacent to the loop coil. For example, where the magnet frame includes flux return members extending between the pole of that side of the subject receiving space, the coil surfaces may be transverse to the surfaces of the flux return members.

Because the coil surfaces are disposed transverse to the surfaces of the magnet frame, parasitic capacitance between the coils and the magnet is minimized. Antenna circuits including the loop coils can be tuned to high frequencies and hence are well suited to operate at high magnetic fields. Because the loop coils define large, open, coil bores suitable for admission of the patient into the subject receiving space, the loop coils do not substantially obstruct entry into the subject receiving space. In a particularly preferred arrangement, the primary field magnet framing includes a plurality of flux return members extending between the poles outside of the subject receiving space. These flux return members are spaced apart from one another to define openings therebetween. Preferably, at least one of the coils extends across one such opening. Thus, the coil bore of each such coil is coincident with the opening defined by the frame itself. Preferably, the windings of the coil are disposed close to the elements of the magnet frame, and the coil bore is of essentially the same size as the opening defined by the magnet frame itself. Thus, the coil does not materially obstruct access to the subject receiving space. Most preferably, the magnet frame includes four return members defining four openings therebetween and four coils are provided, one coil spanning each such opening. These coils can be used as the primary transmitting antenna of the MRI system. They can be employed to transmit RF excitation signals directly into a subject disposed in the subject receiving space. Alternatively, a local antenna circuit in accordance with the previously mentioned aspects of the invention can be used in cooperation with magnet and antenna structures in accordance with this aspect of the invention.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
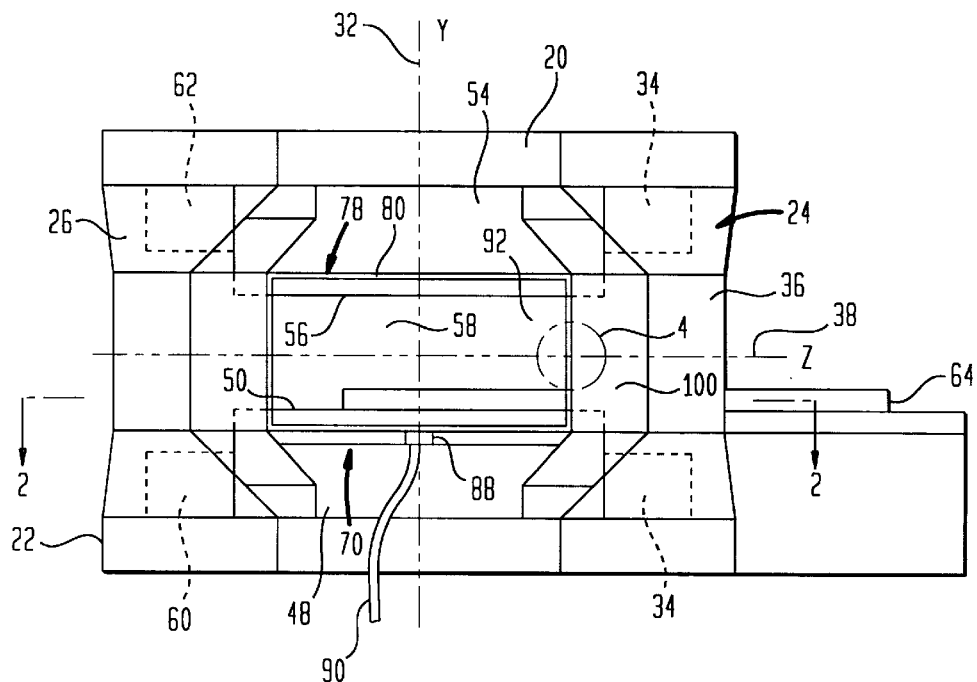
FIG. 1 is an elevational view depicting portions of apparatus in accordance with one embodiment of the invention.

Apparatus in accordance with one embodiment of the invention includes a primary field magnet of the type disclosed in co-pending, commonly assigned U.S. patent application Ser. No. 07/952,810 filed Sep. 28, 1992 entitled Ferromagnetic Yoke Magnets for Medical Magnetic Resonance Studies, the disclosure of which is hereby by reference herein. The primary field magnet includes an upper pole piece support 20 and a lower pole piece support 22 extending in generally parallel, horizontal planes. The pole piece supports are connected to one another by four columns 24, 26, 28 and 30 extending generally vertically between the supports and spaced apart from one another at substantially equal spacings around a central vertical axis 32. As further described in the '810 Application, each column includes end portions 34 which are broad in the circumferential direction around the vertical axis and relatively narrow in the radial direction towards and away from the vertical axis, the end portions being disposed adjacent pole supports 20 and 22. Each column also includes a mid-section 36 of substantially square cross section with substantially equal radial dimension $D_r$ and circumferential dimensions $D_c$. The radial dimensions of the mid-section 36 are greater than the radial dimensions of the end sections 34, whereas the circumferential dimensions of the mid-section 36 are smaller than the circumferential dimensions of end sections 34. As best appreciated with reference to FIG. 1, the columns taper inwardly in the circumferential direction towards the middle of the apparatus.

Figure 6:
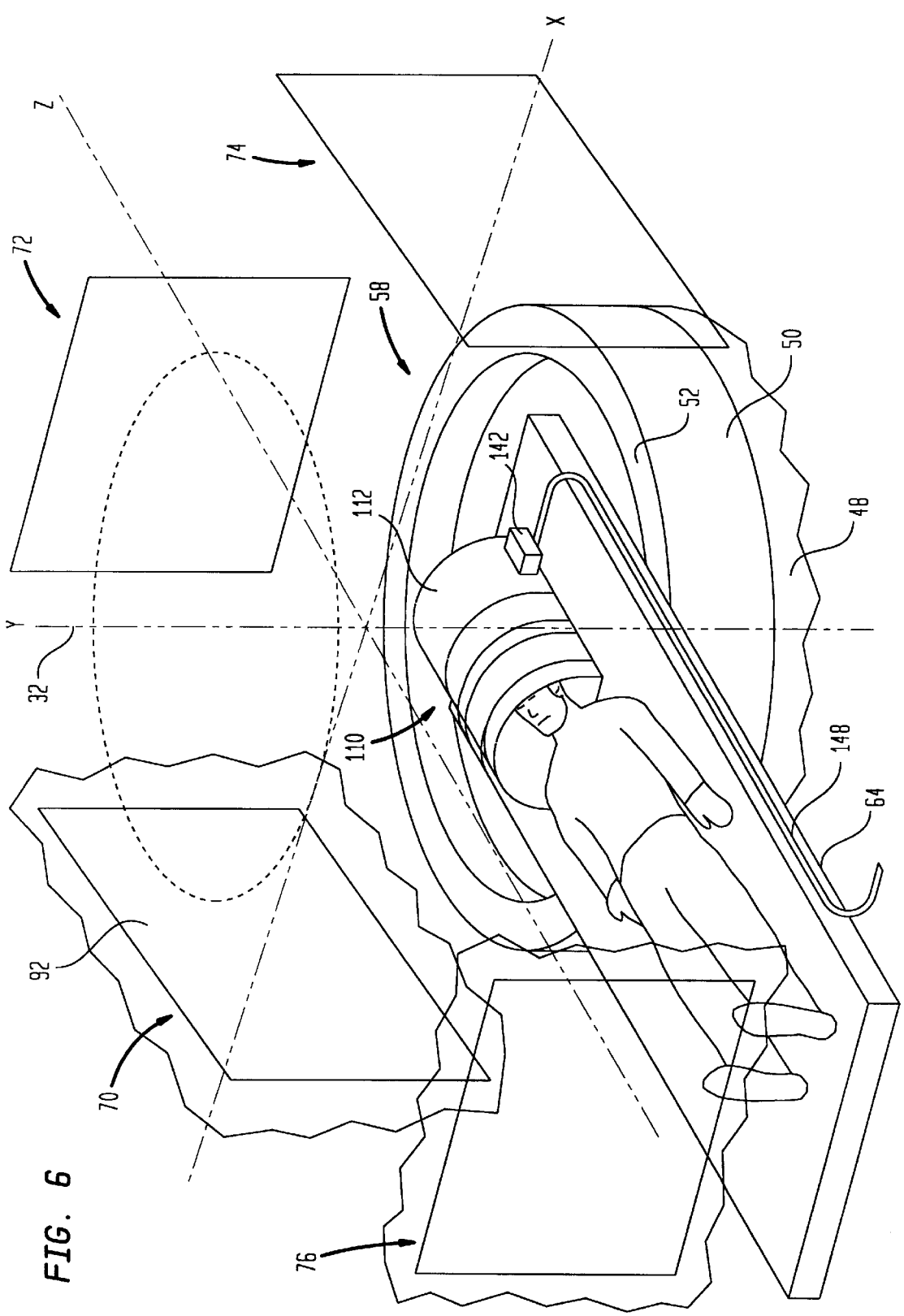
FIG. 6 is a diagrammatic perspective view showing portions of the apparatus of FIGS. 1–5, with parts omitted for clarity of illustration.

The columns define openings 40, 42, 44 and 46 between them. The tapering shape of the columns makes each opening wider adjacent the medial horizontal plane 38 of the apparatus. A lower pole stem 48 extends upwardly from lower pole piece support 22. A pole piece 50 is disposed on the top of lower pole stem 48. As best seen in FIG. 6, lower pole piece 50 is substantially in the form of a circular disk lying in a horizontal plane, and has an upstanding rim or shim bar 52 protruding around the periphery of the disk. A similar ferromagnetic upper pole stem 54 and pole piece 56 extend downwardly from upper pole piece support 20. The pole stems and pole pieces are substantially symmetrical about the central vertical axis 32 of the frame. The confronting pole pieces 50 and 56 cooperatively define a subject receiving space 58 between them, within the circumferentially spaced array of columns 24, 26, 28, and 30. Openings 40–46 provide communication between this subject receiving space 58 and the exterior of the frame. The surfaces of the pole pieces confronting one another from the top and bottom of space 58 extend generally horizontally and parallel to one another.

A pair of primary field coils 60, 62 encircle pole stems 48, 54 adjacent to the upper and lower pole piece supports 20 and 22. These primary field coils are arranged so that upon application of currents through the coils, a magnetic field is generated in vertical directions, parallel to the central axis 32. The flux constituting the field passes through space 58 between poles 50 and 56 and return, in the opposite direction, through columns 24–30. The columns thus act as flux return members between the poles. As described in the aforesaid '810 Application, the field generated by coils 60 and 62 is a substantially homogeneous field of uniform strength throughout a large portion of subject receiving space 58. Conventional gradient coils (not shown) are provided adjacent the surfaces of pole pieces 50 and 56 for inducing gradients in the magnetic field as further discussed below. Also, a patient receiving bed 64 formed from nonmagnetic, preferably polymeric materials is arranged for sliding movement into and out of space 58 through one of the opening 46 between columns 30 and 24.

Figure 4:
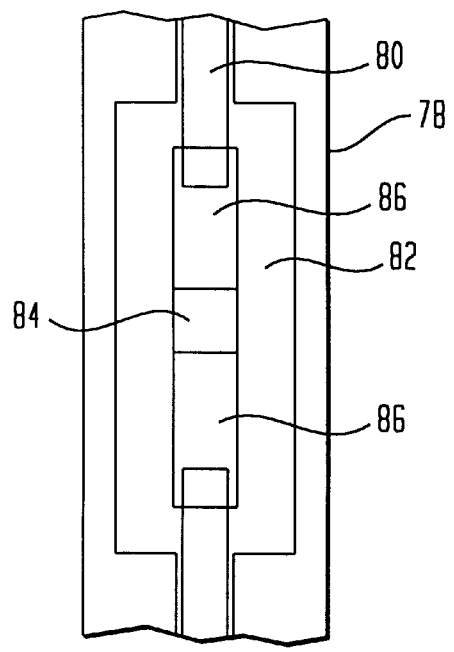
FIG. 4 is a fragmentary elevational view depicting a portion of the apparatus as indicated in FIG. 1.

A principal antenna including four loop coils 70, 72, 74 and 76 is mounted to the frame. Loop coil 70 includes a generally planar, hollow rectangular frame 78 formed from a dielectric material such as a polymer. Preferred polymers are fire-resistant polymers such as polyvinyl chloride, polytetrfluoroethylene ("PTFE") and fluorinated ethylene propylene ("FEP") and other fluoropolymers and chloropolymers. Polymers having low dielectric constants are particularly preferred. A tubular conductor 80 extends substantially around the rectangular perimeter of frame 78. On the scale depicted in FIG. 1, the conductor 80 has the same shape as frame 78. As best seen in FIG. 4, conductor 80 is interrupted along one side and a pocket 82 is formed in frame 78. A capacitor 84 is physically disposed within pocket 82 and electrically connected between ends of conductor 80 by metallic ribbon cables 86. Loop coil 70 is also connected, by a conventional impedance matching circuit and connector 88 to a RF power cable 90. Power cable 90 extends to the other transmitting circuit components discussed below in connection with FIG. 5.

Coil 70 defines an interior opening or coil bore 92 aligned with opening 40 between columns 24 and 26. For use as a whole body scanner, this interior coil bore has the smallest dimension greater than about 28 cm and preferably has an area of about 784 cm$^2$ or more. More preferably, the smallest dimension of the coil bore is at least about 35 cm. Thus, interior opening 92 of coil 70 encircled by conductor 80 has a size sufficient to permit passage of a normal, adult human. Moreover, opening 92 extends upwardly and downwardly beyond pole pieces 50 and 56 and extends horizontally substantially through the full extent of opening 40, between the central portions 36 of columns 24 and 26. Thus, coil 70 does not substantially restrict the size of a person or other object which can be advanced into subject receiving space 58. Each of coils 72, 74 and 76 defines a similar coil bore 92. As best appreciated with reference to FIG. 6, the patient receiving bed is slidably mounted to the apparatus so that it passes through opening 46 between columns 30 and 24 within the coil bore 92 of coil 76.

Figure 2:
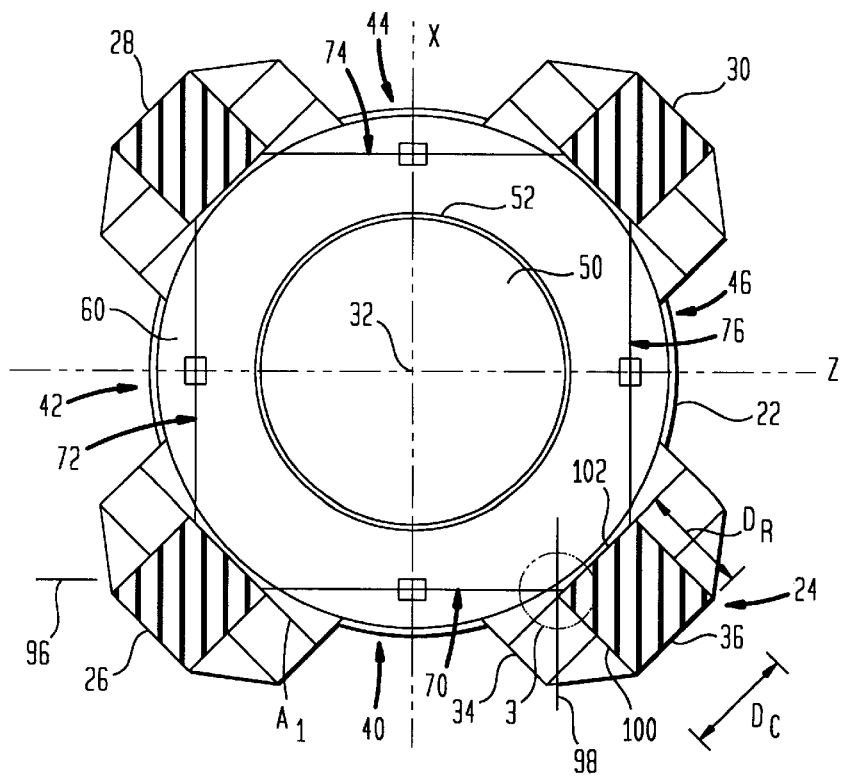
FIG. 2 is a sectional view taken along line 2—2 in FIG. 1, with portions omitted for clarity of illustration.
Figure 3:
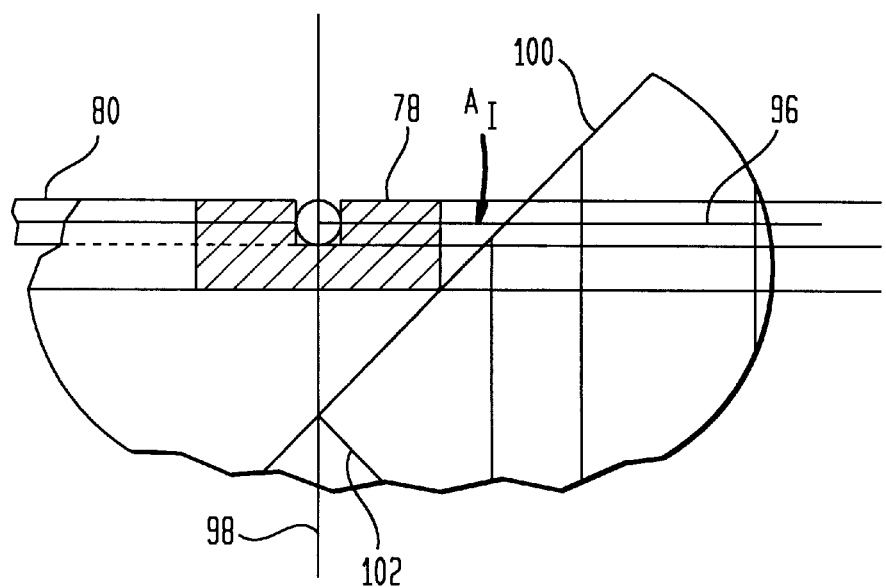
FIG. 3 is a fragmentary sectional view taken on an enlarged scale depicting a portion of the apparatus as indicated in FIG. 2.

Coil 70 defines a planar coil surface 96 (FIGS. 3 and 6 ). As used in this disclosure with reference to a loop-like coil, the term "coil surface" means the surface defined by the center line of the conductor constituting the loop. Where several conductors extend in parallel around the loop, the center line of the conductor should be taken as the line corresponding to the center line of the cross combined area of the parallel conductors when seen in cross section on a plane perpendicular to the lengthwise extent of the conductors. In the simple case of a planar loop coil such as coil 70, the coil surface is simply the plane in which the center line of coil conductor 80 is positioned. Coil surface 96 is substantially transverse to the horizontal, generally planar surface of pole piece 50 and is also substantially transverse to the horizontal surface of pole piece 56. The coil surface is also substantially transverse to the horizontal upper surface of the lower primary field coil 60 and substantially transverse to the horizontal lower surface of the upper primary field coil 62. As best appreciated with reference to FIGS. 2 and 3, the coil surface 96 is also substantially transverse to the surfaces of columns 24 and 26 which are adjacent to the edges of the coil. The surfaces 100, 102 of column 24 extending along a vertical edge of coil 70 lie at oblique angles to the plane of coil surface 96. However, considering the average direction of the column surfaces 100 and 102 over a region encompassing a few centimeters on either side of plane 96, the average direction of the column surfaces 100, 102 is in a plane 98 substantially perpendicular to loop coil plane 96. In determining whether a coil surface is transverse to a surface of the primary field magnet as used in this disclosure, the direction of any surface of the magnet should be considered as the average direction of such surface within about 10 cm of the closest approach of such surface to the coil surface. As used herein, the coil surface should be understood as disposed substantially transverse to the surface of the primary field magnet frame or other component of the primary field magnet if the angle between the surfaces is about 30° or more.

The vertically extending edges of coil 70 extend along vertically extending edges of columns 24 and 26 and the surfaces of the columns slope away from the edges of the coils. Thus, the coil and the columns are in substantially edge to edge disposition. Each of coils 72, 74 and 76 is disposed in the same relationship to the frame, but in alignment with the other openings 42, 44 and 46. Thus, the coil surface of each coil extends generally transverse to the pole surfaces, and generally transverse to the surfaces of the adjacent columns. Each coil is in substantially edge-to-edge disposition with the adjacent columns. Each coil 72,74 and 76 is provided with a power cable similar to the power cable 90 associated with coil 70.

A local antenna 110 is physically mounted on a portion of patient receiving bed 64. Local antenna 110 is in the form of a metallic conductive coil extending on a hollow, shell-like dielectric support 112 which in turn is mounted on bed 64. Essentially any local antenna configuration commonly utilized for receiving MRI resonant signals from a localized region of a subject, can be used.

Figure 5:
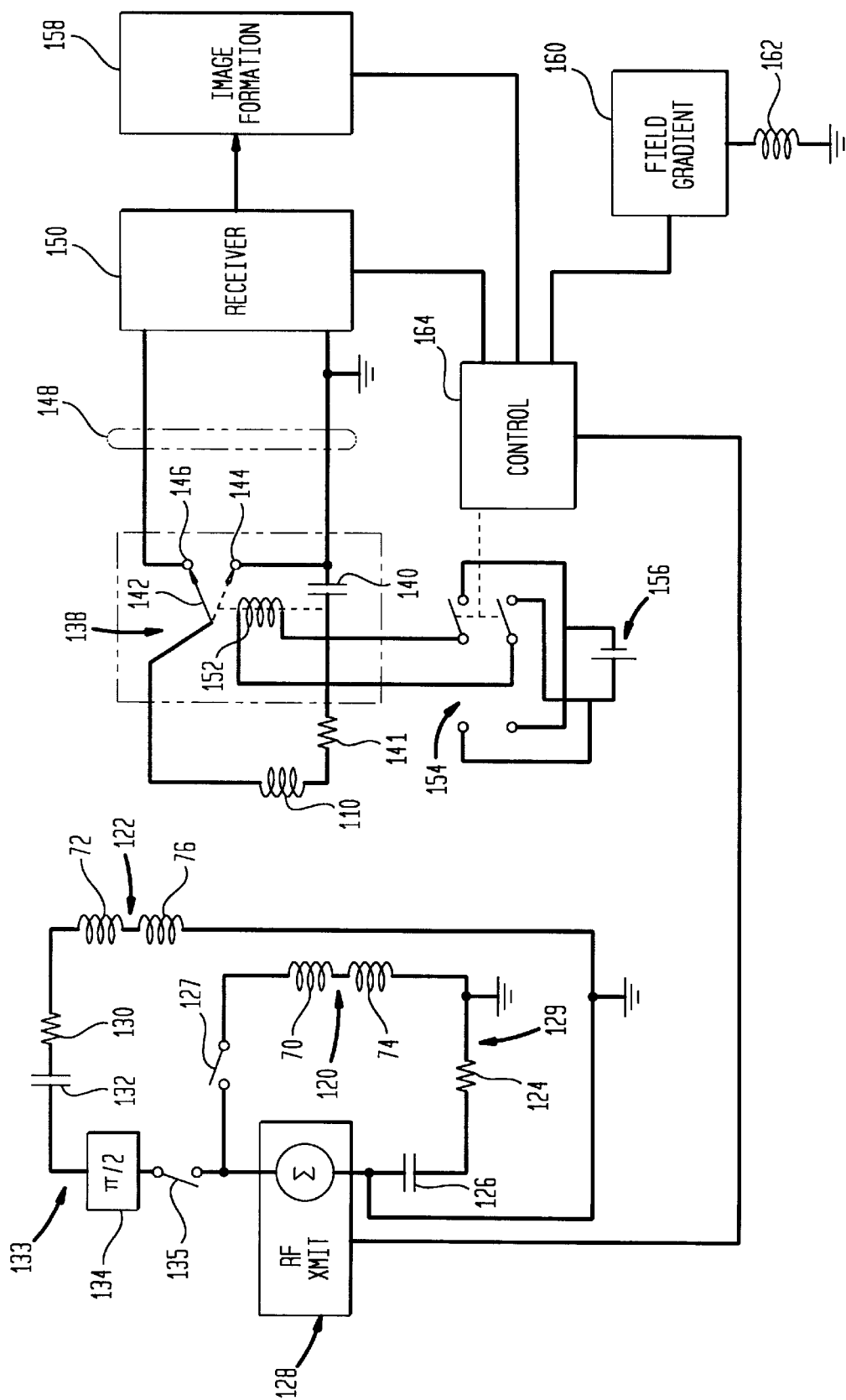
FIG. 5 is a schematic circuit diagram of the apparatus depicted in FIGS. 1–4.

As shown in FIG. 5, coils 70 and 74, disposed on opposite sides of subject receiving space 58 are electrically connected (through their respective power cables 90) in circuit with one another to form a first transmitting coil assembly 120, whereas coils 72 and 76, on mutually opposite sides of the subject receiving space are connected in circuit with one another to form a second transmitting coil assembly 122. The coils 70 and 74 of the first assembly 120 are orthogonal to coils 72, 76 of the second assembly 122. As best seen in FIG. 6, coil 70 and 74 of the first assembly lie in planes perpendicular to one axis through space 58, denoted as the X axis in FIG. 6, whereas coils 72 and 76 lie in planes perpendicular to another horizontal axis denoted Z, the Z axis being perpendicular to the X axis and both being perpendicular to the central axis 32, also referred to as the Y-axis of the system. The coils of each assembly are connected for co-directional current flow. That is, when a current passes through coil 70 in a counterclockwise direction around the X axis (as seen from the right hand end of the drawing in FIG. 6) the current will pass in a counter-clockwise direction around the X axis in coil 74.

The first coil assembly 120 is connected in a circuit 129 having resistance 124 and capacitance 126 across the output of an RF transmitter 128. Resistance 124 and capacitance 126 are lumped representations of the various resistances and capacitances in the system. Thus, resistance 124 includes the resistances of the coils themselves and the associated cables, as well as the RF power dissipation or loading caused by the power transmitted into the subject receiving space. Capacitance 126 includes the parasitic capacitances between the coils and the frame, tuning capacitors such as capacitor 84 (FIG. 4) and cable capacitances. The second coil assembly 122 is connected in a similar circuit 133 with resistance 130 and capacitance 132 and this circuit is connected through a quarter wave or π/2 phase shifting network 134 adapted to delay signals at the frequency to be employed by the RF transmitter by one quarter cycle. The circuit 129 incorporating the first antenna assembly 120 (coils 70 and 74) is equipped with a switch 127, whereas the circuit 133 incorporating the second antenna assembly 122 (coils 72 and 76) is equipped with a switch 135.

Local antenna 110 is connected in a local antenna circuit 138 which incorporates capacitance 140 and resistance 141. The capacitance and resistance may be provided in part by discrete components, such as a tuning capacitor connected in the local antenna circuit and in part by capacitance between the local antenna itself and other elements of the apparatus. The lumped resistance value of resistor 141 also represents power losses from the circuit due to "loading" by the MRI sample, i.e., power lost through radiation from local antenna 110 into the subject. Local antenna circuit 140 is connected to a single pole double throw switch 142 physically mounted to the shell 112 (FIG. 6) holding the local antenna, or physically mounted to the patient receiving bed 64 adjacent local antenna 110. In one position, switch 142 closes circuit 138 as a loop through node 144. In another position, switch 142 connects circuit 138 through switch node 146 and through a lightweight cable 148 extending along the patient receiving bed 64 (FIG. 6) to a radio receiver 150 disposed outside of the primary field magnet.

Switch 142 desirably is solenoid actuated or other remote-control switch. A particularly preferred switch for this application is disclosed in the commonly assigned, co-pending application of Charles Green et al. entitled Electromechanical RF Switch Activated by External Magnetic Field, filed on even date herewith, the disclosure of which is hereby incorporated by reference herein (the "RF Switch Application"). As disclosed in said RF Switch Application, the switch may incorporate an electromagnet 152 mechanically linked to the movable contact of the switch, together with a device, such as a battery 156 and control switch 154 for selectively applying a current through electromagnet 152 in either of two opposite directions. The electromagnet 152 of the switch is disposed within the subject receiving space 58 of the apparatus during use and hence is exposed to the primary magnetic field applied by the primary field magnet. The current applied through the electromagnet interacts with the primary field to provide a magnetomotive force which will drive the electromagnet and the movable contact of the switch to one or another of the aforementioned positions depending upon the direction of current flow in electromagnet 152.

The apparatus further includes conventional equipment 158 for reconstructing an image of a subject from RF signals received by receiver 150, as well as a conventional field gradient generator 160 linked to conventional gradient coils 162. The gradient coils are physically mounted on the primary field magnet frame, typically on the pole pieces 50 and 56. The pole pieces preferably also include eddy current suppressing materials of the type described in copending, commonly assigned U.S. patent application Ser. No. 08/005,296, filed Jan. 19, 1993 entitled Improved Eddy Current Control in NMR Imaging Systems, the disclosure of which is incorporated by reference herein ("the '296 Application"), the disclosure of which is hereby incorporated by reference herein or other eddy-current suppressing materials disclosed in U.S. Pat. No. 5,061,897, the disclosure of which is also hereby incorporated by reference herein ("the '897 Patent"). As set forth in the '897 Patent, materials having high magnetic permeability and relatively high electrical resistivity can be applied in layers on the surfaces of the pole pieces to suppress induction of Eddy currents in the pole pieces by operation of the gradient coils. As set forth in the '296 Application, other materials having high magnetic permeability, but with somewhat lower electrical resistivity than the materials of the '897 Patent, can be used for this purpose.

As also set forth in the '296 Application, the pole piece can incorporate a thin layer of a highly conductive material such as a layer of aluminum foil having a thickness of approximately 0.0003 inches to about 0.0005 inches overlying the eddy current suppressing material. As more fully discussed in the '296 Application, coupling between the RF antennas and the eddy current suppressing materials tends to produce losses in the RF antennas and reduces the Q-factor of the antennas. This, in turn, tends to reduce the signal-to-noise ratio achieved during the imaging procedure. The thin layer of highly conductive material such as aluminum foil overlying the layer of eddy current suppressing material will reduce the coupling between the RF antennas of the system and the eddy current suppressing material and will reduce losses from the RF antennas. The conductive layer typically is connected to ground potential as, for example, to the metallic magnet frame. Presence of the conductive layer tends to place ground potential physically closer to the RF antennas and thus increases parasitic capacitance between the RF antennas and the ground. However, the orientation of the principal antennas, such as coils 70, 72, 74 and 76 with their coil surfaces transverse to the pole surfaces tends to minimize this effect.

The apparatus additionally includes a conventional control computer 164. Receiver 150, image formation unit 158, control computer 164 and the field gradient unit and associated gradient coils 160, 162 may, for example, be of the types sold by the Fonar Corporation of Melville, New York under the designation ULTIMATE™ 7000. Other, suitable components are well-known to those skilled in the MRI art. The control computer is linked to receiver 150, to field gradient unit 160 and to image formation unit 158, as well as to the RF transmitter 128 and the control switch 154 associated with switch 142.

In a method according to one embodiment of the invention, a patient is placed on bed 64 so that a region of interest of the patient, in this case the patient's head, is surrounded by the local antenna 110. The patient and local antenna 110 is advanced into the subject-receiving space 58 through opening 46 of the frame and through the coil bore 92 of loop coil 76, by sliding bed 64 into the apparatus. With the patient in position, the region of interest, and the local antenna 10 are disposed within the subject receiving space 58, adjacent the center of the space. The coils constituting local antenna 110 are oriented substantially orthogonal to the Z-axis of the frame and hence extend substantially parallel to the planes of coils 72 and 76. Switch 127 is open, and switch 135 is closed, so that first coil circuit 129 and first coil assembly 120 (coils 70 and 74) are disconnected from the transmitter, whereas the second coil circuit 133 and second coil assembly 122 (coils 72 and 76) are connected to the transmitter. The primary field coils of the magnet are actuated to apply a primary magnetic field, ideally about three kilogauss or more, and preferably about six kilogauss within subject receiving space 58. Control unit 164 actuates field gradient unit 160, RF transmitter 128 and receiver 150 to perform a series of imaging cycles. During each cycle, control unit 164 actuates RF transmitter 128 to apply an alternating potential at a radio frequency. The frequency of this potential is selected to match the resonant frequency of the particular atomic nuclei to be studied within the patient. The resonant frequency is also referred to as the Larmor frequency. It depends upon the magnitude of the magnetic field. In medical MRI work, hydrogen nuclei or protons are most often the nuclei of interest. With a magnetic field of six kilogauss, the resonant frequency of a proton is about 12 MHz at a field of six kilogauss the resonant frequency of a proton is about 24 MHz.

Within each imaging cycle, transmitter 128 is actuated during discrete transmit intervals to apply RF power to the patient and thus excite the nuclei whereas receiver 150 is actuated during receive intervals to receive the magnetic resonance signals from the patient. Many imaging cycles are well-known. As well-known in the magnetic resonance imaging art, the particular sequences of transmit intervals, field gradients and receive intervals can be used to achieve various imaging effects. Although a full discussion of MRI imaging cycles is beyond the scope of this disclosure, a typical "spin echo" imaging cycle involves application of a "slice select" field gradient in one direction and a first transmit interval during application of the slice select gradient, followed by application of a phase encoding gradient in a phase encoding direction orthogonal to the slice select direction. The slice select gradient is then reapplied and the transmitter is actuated again during a second transmit interval, followed by reapplication of the phase encoding gradient. After a suitable time, the phase encoding gradient is terminated and a readout or frequency encoding gradient is applied in a readout gradient direction orthogonal to the slice select direction and orthogonal to the phase encoding direction. While the readout gradient is applied, the receiver is actuated for a receive interval to receive the magnetic resonance signals from the patient. Because of the slice select gradient only those atomic nuclei lying in a plane perpendicular to the slice select gradient direction will be excited into resonance; nuclei outside of this plane will have resonant frequencies different from the frequency of the transmitted signal. The phase encoding gradient causes the precession or spinning of the atomic nuclei within the patient to speed up or slow down depending upon position in the phase encoding direction. This causes the magnetic resonance signals emitted by different portions of the "slice" to vary in phase depending upon their positions within the slice in the phase encoding direction. The readout gradient also causes the spins to change speed, depending upon their positions in the readout direction. Thus, the magnetic resonant signals received by receiver 150 during the receive interval will include components of various phases and frequencies. Signals at a particular phase and frequency emanate from a particular location within the slice. If the cycle is repeated many times, with different magnitudes of phase encoding and readout gradients on various cycles, the signals accumulated over many cycles will provide sufficient information from which it is possible to prepare a map of signal intensity versus location within the slice. Such a map corresponds to the concentration of atomic nuclei of interest. The map is reconstructed by image formation unit 158 using known computer techniques, and can be presented as a visual picture of the patient.

During each transmit interval, control unit 164 actuates switching unit 154 to maintain local antenna circuit 138 disconnected from node 146 and hence from receiver 150 and connected through node 144, so that the local antenna circuit forms a closed loop. Because the coils of local antenna 110 are substantially parallel to the coils 72 and 76 of the second principal field or coil assembly 122, there is a high degree of inductive coupling between local antenna 110 and the second primary field coil assembly 122. Thus, the RF power applied through principal antenna or coils 72, 76 induces a signal in local antenna 110 of the same frequency but lagging one quarter cycle ($\pi/2$ radians) in phase. This induced signal in turn excites circuit 138 into resonance at the frequency employed by RF transmitter 128. In effect, circuits 133 and 138 act as a single, magnetically coupled resonance circuit.

Local antenna 110 radiates RF power from circuit 138 into subject receiving space 58 and particularly, into the region of interest adjacent the local antenna. The RF power applied by local antenna 110 is particularly intense within the region of interest of the patient encircled by the local antenna coils. This region also receives RF power directly from the principal antenna, i.e., from antenna coils 72 and 76 of principal field antenna assembly 122. Within the region of interest of the patient, substantially more RF power is applied by the combined action of the principal field antenna and the local antenna then would be applied by the principal field antenna alone, without radiation from the local antenna. The RF power applied to the region of interest is proportional to the absolute value of the magnetic field strength H applied by the system at the radio frequency. Preferably, the magnitude $|H_r|$ of the magnetic field strength due to radiation from local antenna 110, measured at the region of interest of the subject, is substantially greater than the magnitude of the magnetic field strength due to radiation from the principal antenna coils 72, 76 ($|H_d|$), also measured at the region of interest of the subject. That is, $|H_r|/|H_d|$ measured at the subject is greater than or equal to 1.0, and more preferably greater than or equal to 5. The magnitude of total field strength $|H|$ applied in the region of interest is greater than $|H_r|$ and thus substantially greater than $|H_d|$. A full discussion and mathematical treatment of the relationships between the total field strength H, and individual field strengths $H_d$ and $H_r$ is set forth in the Appendix at the end of the present specification. Because the total field strength H is substantially greater than $H_d$, the power which must be applied by RF transmitter 128 to achieve a given total magnetic field H within the region of interest is substantially less than that which would be required to achieve the same RF power levels in the region of interest without the action of the local antenna circuit. Stated another way, the local antenna circuit serves to focus the RF power applied by the transmitter within the region of interest.

Circuit 138 carries substantial RF power during each transmit interval. However, during each transmit interval circuit 138 is disconnected from receiver 150 and hence the receiver is not exposed to potentially damaging power levels. Control unit 164 actuates switch 142 so that during each receive interval, local antenna circuit 138 and hence local antenna 110 are connected through cable 148 to receiver 150. Local antenna 110 receives the magnetic resonance or response signals from the subject, and particularly from within the region of interest encircled by the local antenna, and the signals are conveyed to receiver 150 for processing as described above. Because cable 148 and the associated connectors carry only the very low power magnetic resonance signals and do not carry transmitted power, cable 148 may be a light-duty cable which can be readily handled and connected by the personnel operating the imaging unit.

Figure 7:
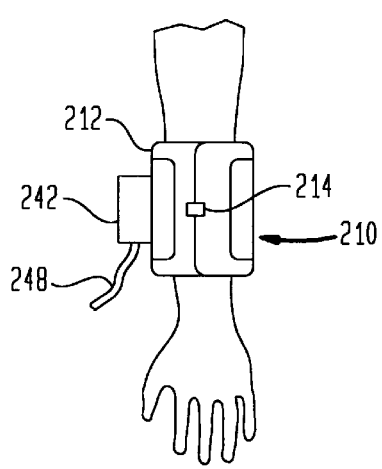
FIGS. 7 through 11 are fragmentary diagrammatic views depicting apparatus in accordance with further embodiments of the invention.

Numerous variations and combinations of the features discussed above, can be utilized. For example, as shown in FIG. 7, a local antenna 210 may be mounted on a structure such as a cuff 212 adapted to encircle a portion of a patient's body so that the cuff, and the antenna itself are physically supported by the patient's body. Typically, such a cuff can be fastened in place by a closure or snap 214 formed from a non-magnetic material. Hook and loop fasteners of the type sold under the registered trademark VELCRO can be employed to fasten the cuff about the patient's body. Here again, the local antenna 210 is equipped with a switch 242 and connected in a local antenna circuit (not shown) similar to that discussed above with reference to FIG. 5. Switch 242 is arranged to selectively connect the local antenna circuit to a cable 248 leading to the receiver.

A patient supported antenna such as antenna 210 of FIG. 7 typically will not be precisely aligned with any particular axis of the primary field magnet assembly and principal transmitting antennas. Thus, a patient-supported antenna may lie at an unknown angle to the X, Y and Z axes depicted in FIG. 6. In this case, it is advantageous to use both principal RF coil assemblies 120 and 122 during the transmit intervals. Thus, the system is operated with switches 135 and 127 closed. When transmitter 128 is actuated, currents flow through both principal antenna circuits 129 and 133. Because of phase shifting network 134, the current in circuit 133 is one quarter wave out of phase with the current in circuit 129; the RF signals radiated from the first principal transmitting assembly 120 (coils 70 and 74 disposed on the X axis) are in quadrature with the field from coils 72 and 76, disposed on the Z axis. The net result is to provide an RF field having direction which continually rotates around the Y axis during each transmit interval. Thus, regardless of the orientation of local antenna 210, the field will be substantially aligned with the sensitive direction or axis of the local antenna at least some times during each transmit interval and hence, power will be coupled into the local antenna circuit. A rotating field of this nature can also be used in conjunction with an antenna mounted to the patient receiving bed or other antenna mounted in known orientation. Moreover, such a rotating field can be employed where the local antenna is not used during the transmit intervals, i.e., where the local antenna circuit is open circuited during the transmit intervals. In this case, the local antenna is used only during the receive cycle. Conversely, the local antenna may include two antennas orthogonal to one another and connected together by a phase shifting network similar to the phase shifting network 134 used in the principal antenna circuits. In this case, the local antenna provides quadrature reception and retransmission of RF signals. Thus, the local antenna will receive and retransmit RF excitation signals applied by the principal antenna regardless of the orientation of the local antenna with respect to the principal antenna. Also, such a quadrature local antenna tends to provide greater sensitivity to the RF response signals from the subject.

Figure 8:
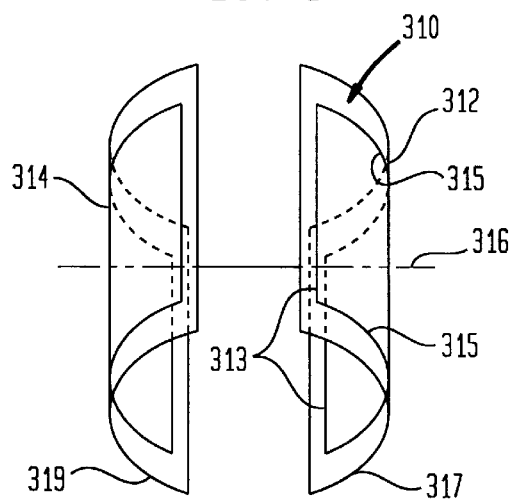

As seen in FIG. 8, a local antenna 310 need not incorporate helical coils but instead may include a pair of saddle-shaped coils 312, 314 connected in series or in parallel with one another. Saddle-shaped coil 312 includes a pair or straight, elongated conductors 313 extending parallel to one another and a pair of curved conductors 315, connecting the ends of the straight conductors. Coil 312 defines a coil surface 317 generally in the form of the cylindrical surface swept by a straight generating line moving along curved conductors 315. The opposite saddle-shaped coil 314 defines a similar curved coil surface 319. Saddle-shaped coils of this nature are sensitive to fields directed along axis 316 through the center of the coils and perpendicular to their respective coil surfaces. Other, conventional coil configurations can also be used as the local antenna.

Figure 9:
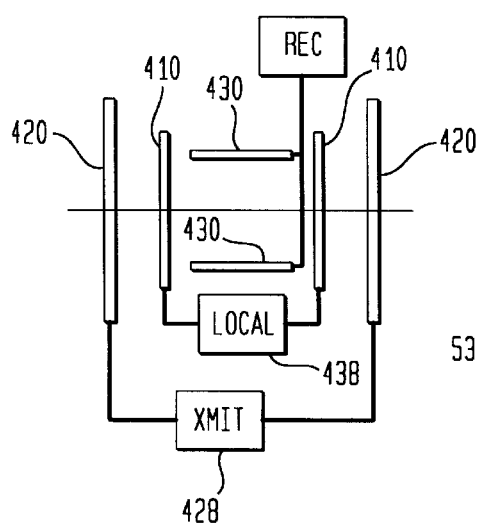
Figure 10:
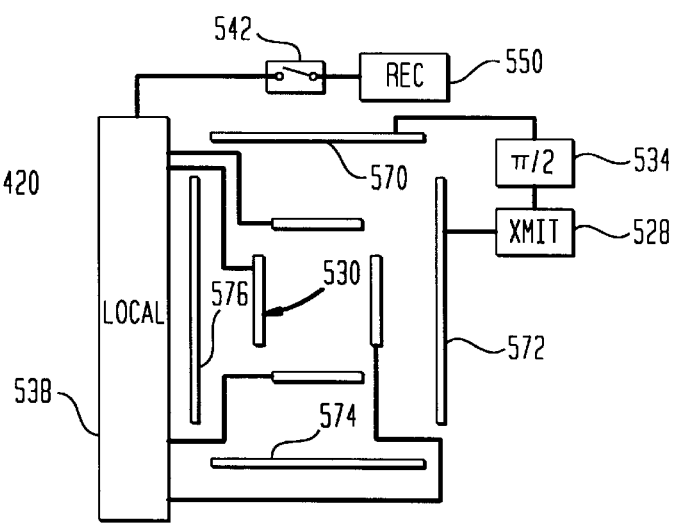

As shown in FIG. 9, a local antenna 410 is connected to a local antenna circuit 438 similar to circuit 138 discussed above with reference to FIG. 5. However, no switching arrangement is provided. Instead, local antenna circuit 438 is permanently connected as a closed loop. Local antenna 410 is disposed within the subject receiving space and is oriented so that the local antenna is sensitive to radio frequency signals from principal transmitting antenna 420. A separate receiving antenna 430 is oriented orthogonally to principal transmitting antenna 420 and orthogonally to local antenna 410, and is mounted within the subject receiving space of the apparatus. Receiving antenna 430 remains permanently connected to the RF receiver 150. In operation, when RF transmitter 428 is actuated, during transmit intervals, coupling between the principal antenna 420 and local antenna 410 excites the local antenna circuit 438 in the same manner as discussed above and once again the local antenna 410 retransmits RF power into the subject receiving space adjacent the area of interest. However, because receiving antenna 430 is orthogonal to the principal antenna and orthogonal to the local antenna, there is essentially no coupling between local antenna 410 and receiving antenna 430, or between principal antenna 420 and the receiving antenna 430. Therefore, the receiver is not exposed to the powerful RF signals applied by transmitter 428. During the receive intervals, the magnetic resonance signal is acquired by receiving antenna 430. Receiving antenna 430 is shown in FIG. 9 as a pair of opposed elements disposed on opposite sides of the area of interest. The receiving antenna may constitute a pair of circular coils, commonly referred to as Helmholtz coils. To provide the most uniform antenna gain, the coils may be spaced apart from one another by a distance equal to one-half of the diameter of each coil. Local antenna 410 may also include a pair of Helmholtz coils spaced apart from one another in the same manner. This provides a particularly uniform excitation within the area of interest. The same arrangement can be used for a single antenna which serves both as the receiving antenna and the local antenna for reradiating the excitation signal.

In a system according to a further variant, local antenna 530 includes a plurality of conductors or portions of conductors extending in various dispositions so that the local antenna has sensitivity along a plurality of axes. The principal transmitting antenna system utilizes coils 570, 574 constituting one coil assembly and other coils 572, 576, having a second coil assembly orthogonal to the first coil assembly. Here again, one of the coil assemblies is connected through a phase shifting circuit 534 to the transmitter 528. All of the elements in the local antenna 530 are connected to a local antenna circuit 538 which in turn is connected through a switch 542 to the receiver 550. During the transmit interval, the orthogonally oriented principal transmitter coils provide a continually rotating RF field. The local antenna 530 is excited by this RF field at all orientations of this field. In other respects, operation of this system is similar to that described above with reference to FIGS. 1–6.

Figure 11:
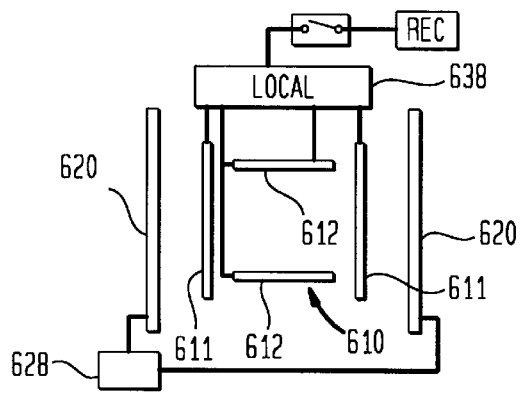

As seen in FIG. 11, the local antenna circuit 638 may be connected to an excitation antenna 611 positioned and oriented for particularly efficient coupling to the principal transmitter antenna 620. For example, excitation antenna 611 may lie in planes parallel to the planes of the elements constituting the principal transmitting antenna and may be positioned close to the edges of the subject receiving space, adjacent the principal transmitter antenna. The local antenna circuit 638 is also connected to a local antenna 612 which has a lesser degree of coupling to the principal transmitting antenna. For example, the local antenna 612 may be disposed orthogonal to the elements of the principal transmitting antenna or may be further from the principal transmitting antenna. When an RF field is applied by the principal transmitting antenna, during operation of transmitter 628, RF power is transferred into local antenna circuit 638 principally through excitation antenna 611. The power in circuit 638 is radiated from the excitation antenna 611 and also from local antenna 612, so that substantial amounts of power are transferred into the region of interest adjacent local antenna 612. Such a local antenna circuit may be used for receiving signals from the region of interest. Alternatively, a local antenna circuit of this nature can be used in conjunction with a separate receiving antenna (not shown).

Figure 12:
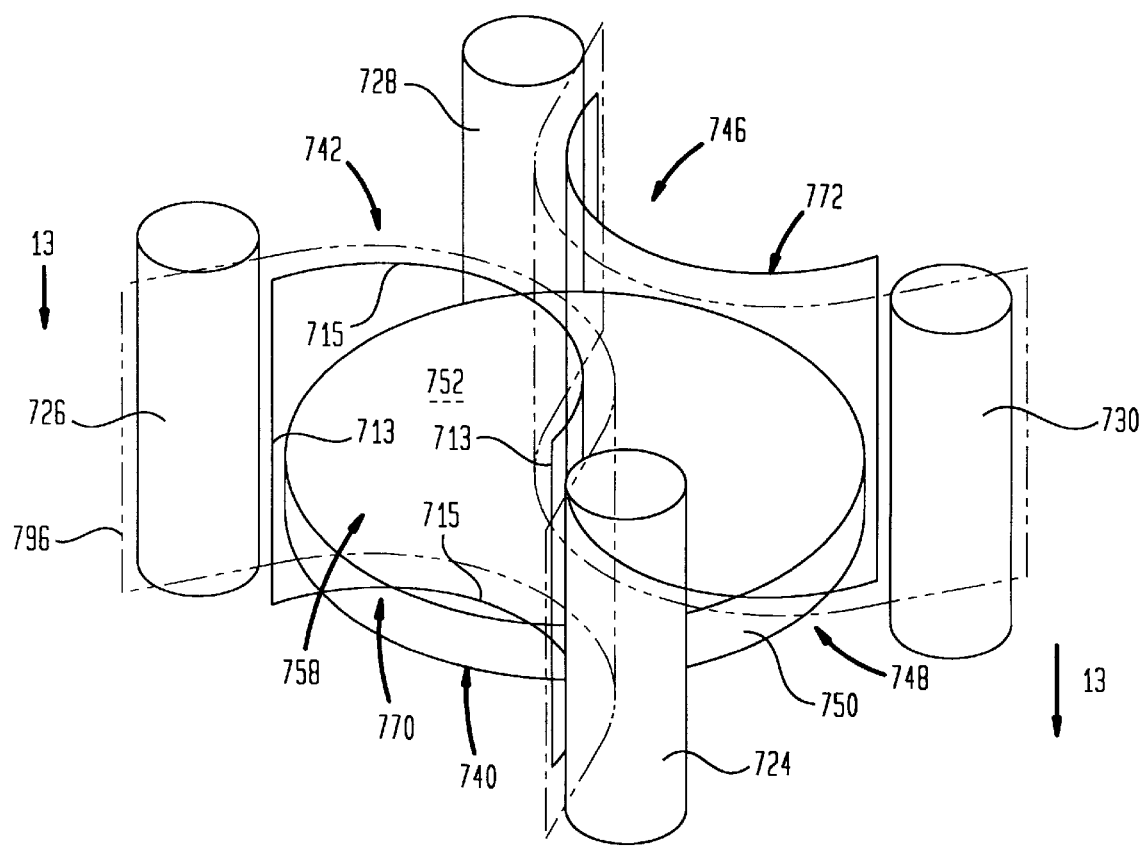
FIG. 12 is a diagrammatic perspective view depicting portions of apparatus in accordance with yet another embodiment of the invention.
Figure 13:
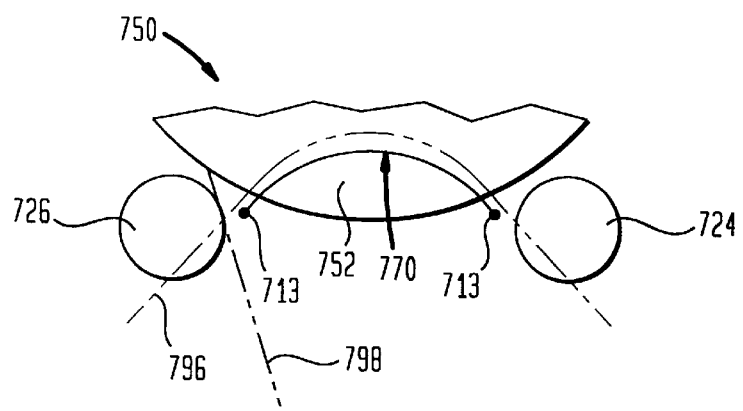
FIG. 13 is a fragmentary sectional view taken along line 13—13 in FIG. 12.

Apparatus according to a further embodiment of the invention includes a primary field magnet frame having columns 724, 726, 728, 730. The particular columns illustrated are of round cross section. These columns are spaced around the subject receiving space 758 and thus define openings 740, 742, 746, 748 between them. The primary field magnet also includes a cylindrical bottom pole piece 750 and a similar top pole piece (not shown) confronting the subject receiving space 758 on the bottom and top. The principal transmitting antenna includes a pair of saddle-shaped coils 770, 772 disposed on opposite sides of the subject receiving space. Coil 770 is aligned with opening 740 between columns 724 and 726. As discussed above in relation to FIG. 8, each saddle-shaped coil defines a curving coil surface 796, shown in broken lines in FIGS. 12 and 13. As best appreciated with reference to FIG. 13, surface 796 is transverse to the circumferential surfaces of cylindrical columns 724 and 726. Thus, the coil surface 796 is transverse to a tangent 798 to the column surface at the point of intersection between the coil surface and the column surface. Also, the coil surface 796 is substantially perpendicular to the horizontal top surface 752 of the pole piece 750. In this arrangement as well, each coil of the principal transmitting antenna defines a coil bore aligned with the opening between the adjacent columns. Also, each coil has a pair of opposite edges, defined by straight runs 713 extending along the columns and another pair of edges, defined by curvilinear runs 715 extending over the pole piece surface 752. In a further alternative embodiment, the saddle-shaped coils can be oriented with curvilinear runs 715 bowed outwardly, away from the pole piece rather than inwardly as illustrated in FIG. 12.

Apparatus according to a further of the invention utilizes a solenoidal primary field magnet incorporating primary field coils 800 encircling a principal magnet axis 801 and arranged so that electrical currents applied in the primary field coils create a primary magnetic field with lines of flux generally parallel to the principal axis 801. The primary field coils 800 may be of conventional conductive or superconductive type. The apparatus further includes saddle-shaped principal transmitting antennas 803, 805 defining elongated conductors 807 parallel to principal axis 801. In the conventional manner, the saddle-shaped principal RF transmitting antennas provide RF excitation. Typically, the primary field coils 800 and the principal RF transmitting antennas are mounted to the frame of the apparatus (not shown) so that a subject-receiving bore is provided in the space immediately surrounding axis 801. Thus, the patient or other subject can be advanced into the apparatus, within coils 800 and between antennas 803 and 805 by a bed or other similar mechanism moving generally parallel to axis 801.

Figure 14:
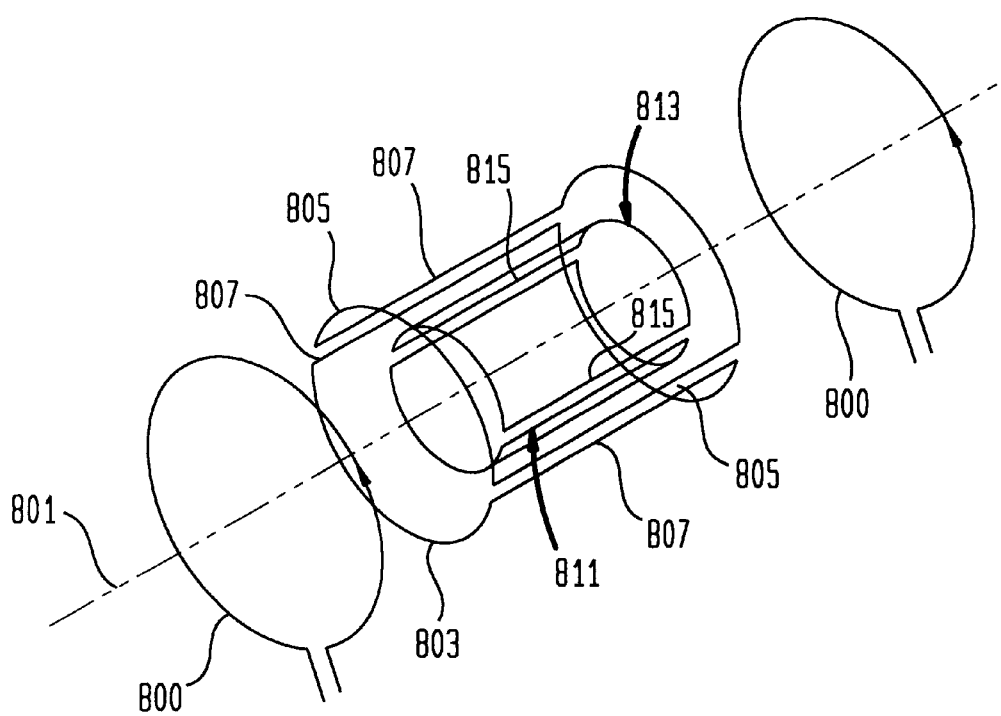
FIG. 14 is a diagrammatic perspective view depicting portions of apparatus in accordance with yet another embodiment of the invention.
Figure 15:
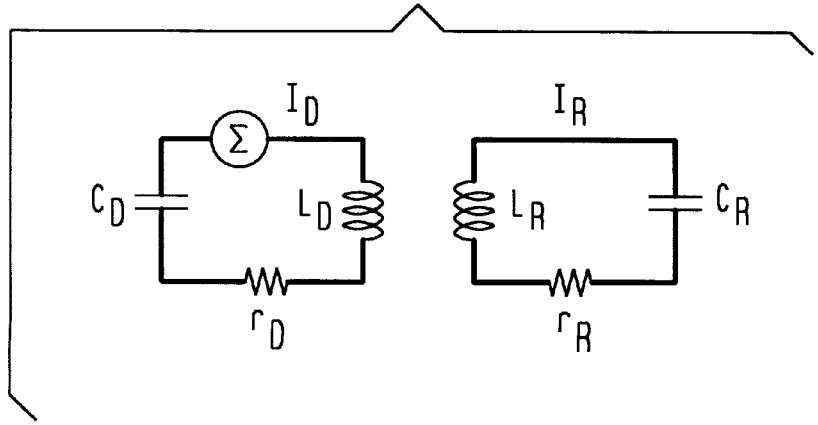
FIG. 15 is a schematic circuit diagram.

The apparatus of FIG. 14 further includes a local antenna. The local antenna includes a pair of saddle-shaped coils 813 and 811 defining conductive runs 815 parallel to the runs 807 of the principal antennas. Here again, the local antenna may be mounted to the frame of the apparatus or, preferably, may be carried on the subject or on a carriage or other device which positions the subject within the subject receiving space. Apparatus according to this embodiment of the invention can be utilized in substantially the same way as the apparatus discussed above.

The embodiments discussed above are configured as "whole body" scanners. Thus, the subject receiving space defined by the primary field magnet, such as space 58 (FIG. 1) and the openings for communication between the subject receiving space and the exterior of the frame, such as openings 40–46 (FIGS. 1–2) are of sufficient size to accommodate the torso of normal human being, and the coil bores or interior openings 92 of the principal are also of sufficient size to permit passage of a normal, adult human torso. However, the invention can also be applied in conjunction with smaller-sized apparatus arranged to perform MRI imaging of the head, limbs or extremities of a human, or to perform MRI imaging of a non-human subject. For example, the subject receiving space, openings and coil bores may be sized to permit passage of only the head, limbs or extremities of a human subject. Also, the means used to position the subject within the subject receiving space need not include a slidable bed or platform as illustrated. For example, where the apparatus is intended for scanning the head, limbs or extremities of the patient appropriate supports or braces may be provided for engaging these body parts and holding the same in steady position within the subject receiving space of the apparatus.

As these and other variations and combinations of the features discussed above can be utilized without departing from the present invention, the foregoing description of the preferred embodiment should be taken by way of illustration rather than by limitation of the invention as defined by the claims.

APPENDIX

An equivalent circuit representation of the principal transmitting antenna and local antenna is shown in FIG. 14. In this circuit, $I_D$ is the current in the principal transmitting antenna or "driver" induced by the electromotive force E, supplied by the transmitter across the capacitance $C_D$ of the driver or principal antenna circuit. $L_D$ is the inductance of the driver coil or coils, $r_D$ is the effective series resistance in the driver circuit (includes all losses), $I_R$ is the current induced in the local antenna or "re-transmitter" coil, $L_R$ is the re-transmitter or local antenna inductance. $C_R$ is the capacitance in the local antenna or re-transmitter circuit, $r_R$ is the effective series resistance of the local antenna or re-transmitter circuit (includes all losses, primarily due to the loading of the re-transmitter coil by the subject or patient), M is the mutual inductance between the driver coil and the retransmitter coil. From Kirchhoff's law:

$$E = Z_D I_D + jwMI_R \quad (1)$$

$$0 = jwMI_D + Z_R I_R \quad (2)$$

Here w is the NMR angular velocity and:

$$Z_D = r_D + j\left(wL_D - \frac{1}{wC_D}\right) \quad (3)$$

$$Z_R = r_R + j\left(wL_R - \frac{1}{wC_R}\right) \quad (4)$$

From (1) and (2) we find $$I_R = -\frac{jwME}{w^2M^2 + Z_D Z_R} \quad (5)$$

$I_R$ is a function of w and it has resonant behavior. Maximum current $I_R$, to generate the strongest RF field H in the region of interest of the local antenna is induced at resonance of the combined driver (principal antenna) and re-transmitter (local antenna) system.

The maximum current can be determined from:

$$\frac{\partial}{\partial w}I_R(w) = \frac{\partial}{\partial w}\frac{wM}{w^2M^2 + Z_D(w)Z_R(w)} = 0 \quad (6)$$

In practice, the mutual inductance M is small, so that $w^2M^2 \ll |Z_D Z_R|$ and thus $$I_R = -\frac{jwME}{Z_D Z_R} \quad (7)$$

Because of the weak (under critical) coupling the driver resonant circuit and the re-transmitter resonant circuit can be co-tuned to one signal, resonance frequency. Formula (5) reduced to:

$$I_R = -\frac{jwME}{r_D r_R} \quad (8)$$

In terms of Q-values, $Q_D = wL_D/r_D$ and the (loaded) $Q_R = wL_R/r_R$. M is parametrized as $M = k\sqrt{L_D L_R}$ where k is the coupling coefficient $0 \leq k \leq 1$. Thus, formula (8) can be written in the form $$I_R = jkQ_D Q_R \frac{E}{w\sqrt{L_D L_R}} \quad (9)$$

From equation (1) the current in the driver is $I_D = E/R_D$, the reactive effects of the re-transmitter being negligible. This means that the current $I_R$ is delayed by ¼ of the period of the RF signal relative to the current $I_D$. The magnetic field strength is directly proportioned to the current $I_R$ and $I_D$, $H_R I_R H_D I_D$, where $H_R$ is the magnetic field strength due to the local antenna and $H_D$ is the magnetic field strength due to the principal antenna. Therefore, the total magnetic field strength |H| seen by the NMR sample is related to $H_R$ and $H_D$ as follows:

$$|H| = |H_D e^{j\phi_D} + H_R e^{j\phi_R}| \quad (10)$$

Where $\phi_D$ and $\phi_R$ are the phase angles of the currents in the principal and local antennas, respectively. But $\phi_D = \phi_R + \pi/2$, so:

$$|H| = \left|e^{j\phi_R}\left(H_D e^{\frac{j\pi}{2}} + H_R\right)\right| = \sqrt{H_D^2 + H_R^2} \cong |H_R| = \frac{kQ_D Q_R E}{w\sqrt{L_D L_R}} \quad (11)$$

or in terms of RF power $P = E I_D = E^2/r_D$, delivered by the transmitter, we get $$|H_R| \cong k\sqrt{\frac{Q_D Q_R P}{r_R}} \quad (12)$$

What is claimed is:

1. Magnetic resonance apparatus comprising:
   (a) a frame defining a first pole having a first pole surface, and a subject-receiving space adjacent said first pole;
   (b) a source of magnetic flux associated with said frame for directing flux through said first pole and into said subject-receiving space;
   (c) a first loop coil mounted to the frame adjacent the subject-receiving space on a first side thereof, the first loop coil having a winding defining a first coil surface substantially transverse to the first pole surface;
   (d) a second loop coil mounted to the frame adjacent the subject-receiving space on a second side thereof opposite from said first side, said second loop coil having a winding defining a second coil surface substantially transverse to the first pole surface; and
   (e) a transmitter connected to said loop coils for transmission of RF excitation signals into the subject-receiving space,
   wherein said windings of said first loop coil encircle a coil bore having a smallest dimension of at least about 28 cm, the apparatus further comprising means for introducing a patient into said subject-receiving space through said coil bore.

2. Magnetic resonance apparatus comprising:
   (a) a frame defining a first pole having a first pole surface, a second pole having a second pole surface, and a subject-receiving space between said poles;
   (b) a source of magnetic flux associated with said frame for directing flux through said first pole and into said subject-receiving space;
   (c) a first loop coil mounted to the frame adjacent the subject-receiving space on a first side thereof, the first loop coil having a winding defining a first coil surface substantially transverse to the first and second pole surfaces;
   (d) a second loop coil mounted to the frame adjacent the subject-receiving space on a second side thereof opposite from said first side, said second loop coil having a winding defining a second coil surface substantially transverse to the first and second pole surfaces; and (e) a transmitter connected to the said loop coils for transmission of RF excitation signals into the subject-receiving space, wherein said windings of said first loop coil encircle a coil bore having a smallest dimension of at least about 28 cm, the apparatus further comprising means for introducing a patient into said subject-receiving space through said coil bore.

3. Apparatus as claimed in claim 2 wherein said first and second poles are spaced apart from one another along an axis, with said pole surfaces facing towards one another in opposite axial directions and extending in radial directions outwardly from said axis, said subject-receiving space being disposed between said pole surfaces, each of said coils having a first edge disposed adjacent one said pole and a second edge disposed adjacent the other said pole.

4. Apparatus as claimed in claim 3 wherein said coils are substantially planar and parallel to one another.

5. Apparatus as claimed in claim 3 wherein said frame further includes at least one return member extending between said poles outside of said subject-receiving space, and wherein at least one of said coils has a third edge disposed adjacent one said return member.

6. Apparatus as claimed in claim 3 wherein said frame includes a plurality of return members extending between said poles outside of said subject-receiving space, said members being spaced apart from one another so that at least one pair of mutually-adjacent ones of said members defines at least one opening therebetween, and wherein at least one of said coils extends across one said opening, each coil extending across one said opening having third and fourth edges disposed adjacent the members defining that opening.

7. Apparatus as claimed in claim 3 wherein said first and second edges of said coils are spaced radially outwardly from said poles.

8. Magnetic resonance apparatus comprising:
(a) a magnet including a frame defining a subject-receiving space and a source of magnetic flux associated with said frame for directing flux into said subject-receiving space;
(b) a first loop coil mounted to the frame adjacent the subject-receiving space on a first side thereof, the first loop coil having a winding defining a first coil surface, said first coil surface being transverse with respect to all surfaces of said magnet adjacent thereto;
(c) a second loop coil mounted to the frame adjacent the subject-receiving space on a second side thereof opposite from said first side, said second loop coil having a winding defining a second coil surface substantially parallel to the first coil surface and transverse with respect to all surfaces of said magnet adjacent said second coil surface; and
(d) a transmitter connected to the first loop coil for transmission of RF excitation signals into the subject-receiving space
said frame defining two poles spaced apart from one another along an axis, said poles having pole surfaces facing towards one another in opposite axial directions and extending in radial directions outwardly from said axis, said subject-receiving space being disposed between said pole surfaces, each said coil having a first edge disposed adjacent one said pole and a second edge disposed adjacent the other said pole,
said frame further including at least one return member extending between said poles outside of said subject-receiving space, at least one of said loop coils having a third edge disposed adjacent one said return member.

9. Apparatus as claimed in claim 8 wherein said windings of said first loop coil encircle a coil bore having a smallest dimension of at least about 28 cm.

10. Apparatus as claimed in claim 9 further comprising means for introducing a patient into said subject-receiving space through said coil bore.

11. Apparatus as claimed in claim 8 wherein said coils are substantially planar.

12. Apparatus as claimed in claim 8 wherein said frame includes a plurality of said return members extending between said poles outside of said subject-receiving space, said members being spaced apart from one another so that at least one pair of mutually-adjacent ones of said members defines at least one opening therebetween, and wherein at least one of said coils extends across one said opening, each coil extending across one said opening having third and fourth edges disposed adjacent the return members defining that opening.

13. Apparatus as claimed in claim 8 wherein said first and second edges of said coils are spaced radially outwardly from said poles.

14. Apparatus as claimed in claim 8 wherein said magnet is adapted to provide a static magnetic field of preselected magnitude within said subject-receiving space, whereby protons in said subject-receiving space will have a preselected Larmor frequency, each said loop coil having parasitic capacitance to said frame and self-inductance in the presence of said frame, said parasitic capacitance and inductance being low enough that each said loop coil has an untuned resonant frequency above said preselected Larmor frequency.

15. Apparatus as claimed in claim 8 wherein each said loop coil has parasitic capacitance to said frame and self-inductance in the presence of said frame, said parasitic capacitance and inductance being low enough that each said loop coil has an untuned resonant frequency above about 12 MHz.

16. Apparatus as claimed in claim 15 wherein said untuned resonant frequency is above about 25 MHz.

17. Apparatus as claimed in claim 8 further comprising a receiver adapted to receive magnetic resonance signals from within said patient-receiving space.

18. Apparatus as claimed in claim 8 further comprising a local antenna circuit including a local antenna, means for mounting the local antenna within the subject-receiving space, and a receiver for receiving magnetic resonance signals, said local antenna circuit being coupled to said first loop coil for transmission of RF power from said first loop coil to said local antenna circuit, said local antenna being adapted to radiate RF power from said local antenna circuit within said patient-receiving space.

19. Apparatus as claimed in claim 18 wherein said means for mounting the local antenna within the subject-receiving space includes means for physically mounting the local antenna on a subject so that the local antenna will be disposed within the subject receiving space when the subject is received in said space.

20. Magnetic resonance apparatus comprising:
(a) a magnet including a frame defining a subject-receiving space, a pair of opposed poles spaced apart from one another along a pole axis extending through the subject-receiving space, said poles having pole surfaces facing toward one another in opposite axial directions, said pole surfaces extending in radial directions transverse to the pole axis, said frame further including a plurality of flux return members extending generally axially and connecting said poles to one another, said members being spaced apart from one another in circumferential directions around said poles and defining one or more openings between adjacent members, said magnet further including a source of magnetic flux associated with said frame for directing flux into said subject-receiving space through said poles;

(b) a first loop coil mounted to the frame in a first said opening, the first loop coil having a winding including a pair of axial runs extending generally axially alongside the flux return members defining the first said opening and a pair of transverse runs extending generally transverse to the pole axis at locations axially adjacent the poles; and (c) a transmitter connected to the first loop coil for transmission of RF excitation signals into the subject-receiving space.

21. Apparatus as claimed in claim 20 wherein said first loop coil defines a first coil bore having a smallest dimension of at least about 28 cm aligned with the first said opening of said frame, whereby a subject can enter and leave said subject-receiving space through said first coil bore.

22. Apparatus as claimed in claim 20 further comprising a patient receiving bed mounted for sliding movement into and out of the subject-receiving space through said first coil bore and said first opening of said frame.

23. Magnetic resonance apparatus comprising:

(a) a magnet including a frame defining a subject-receiving space, a pair of opposed poles spaced apart from one another along a pole axis extending through the subject-receiving space, said poles having pole surfaces facing toward one another in opposite axial directions, said pole surfaces extending in radial directions transverse to the pole axis, said frame further including four flux return members extending generally axially and connecting said poles to one another, said members being spaced apart from one another in circumferential directions around said poles and defining four openings between adjacent members, said magnet further including a source of magnetic flux associated with said frame for directing flux into said subject-receiving space through said poles;

(b) at least two loop coils, each said loop coil being mounted to the frame and disposed in one said opening, each loop coil having a winding including a pair of axial runs extending generally axially alongside the flux return members defining the associated opening and a pair of transverse runs extending generally transverse to the pole axis at locations axially adjacent the poles; and (c) a transmitter connected to said loop coils for transmission of RF excitation signals into the subject-receiving space.

24. Apparatus as claimed in claim 23 wherein said at least two loop coils includes four loop coils.

25. Apparatus as claimed in claim 23 wherein said magnet is adapted to provide a static magnetic field of preselected magnitude within said subject-receiving space, whereby protons in said subject-receiving space will have a preselected Larmor frequency, each said loop coil having parasitic capacitance to said frame and self-inductance in the presence of said frame, said parasitic capacitance and inductance being low enough that each said loop coil has an untuned resonant frequency above said preselected Larmor frequency.

26. Apparatus as claimed in claim 23 wherein each said loop coil has parasitic capacitance to said frame and self-inductance in the presence of said frame, said parasitic capacitance and inductance being low enough that each said loop coil has an untuned resonant frequency above about 12 MHz.

27. Apparatus as claimed in claim 26 wherein said untuned resonant resonant frequency is above about 25 MHz.

28. Apparatus as claimed in claim 23 further comprising a local antenna circuit including a local antenna, means for mounting the local antenna within the subject-receiving space, and a receiver for receiving magnetic resonance signals, said local antenna circuit being coupled to said loop coils for transmission of RF power from said loop coils to said local antenna circuit, said local antenna being adapted to radiate RF power from said local antenna circuit within said patient-receiving space.

29. Apparatus as claimed in claim 23 a first one of said at least two loop coils defines a first coil bore having a smallest dimension of at least about 28 cm aligned with a first one of said openings of said frame, whereby a subject can enter and leave said subject-receiving space through said first coil bore.

30. Apparatus as claimed in claim 23 further comprising a patient receiving bed mounted for sliding movement into and out of the subject-receiving space through said first coil bore and said first one of said openings of said frame.

31. Magnetic resonance apparatus comprising:

(a) a magnet including a frame defining a subject-receiving space and a source of magnetic flux associated with said frame for directing flux into said subject-receiving space;

(b) a first loop coil mounted to the frame adjacent the subject-receiving space, the first loop coil having a winding defining a first coil surface, said first coil surface being transverse with respect to all surfaces of said magnet adjacent thereto, said winding of said first loop coil being constituted by a conductor of circular cross-sectional shape; and (c) a transmitter connected to the first loop coil for transmission of RF excitation signals into the subject-receiving space.

32. Apparatus as claimed in claim 31 wherein said loop coil includes only a single turn of said conductor.

* * * * *

UNITED STATES PATENT AND TRADEMARK OFFICE
CERTIFICATE OF CORRECTION

PATENT NO.    : 6,229,310 B1
DATED         : May 8, 2001
INVENTOR(S)   : Green et al.

It is certified that error appears in the above-identified patent and that said Letters Patent is hereby corrected as shown below:

<u>Title page,</u>
Item [74] Attorney, Agent or Firm, "Krumholtz" should read -- Krumholz --.

<u>Column 1,</u>
Line 18, after "space" insert -- of --.

<u>Column 4,</u>
Line 8, change "are" to -- is --.
Line 64, after "to" insert -- the --

<u>Column 6,</u>
Line 39, after "hereby" insert -- incorporated --.

<u>Column 7,</u>
Line 34, change "opening" to -- openings --.
Line 52, change "88 to" to -- 88, to --.

<u>Column 8,</u>
Line 64, change "subject, can" to -- subject can --.

<u>Column 9,</u>
Line 7, change "coil" to -- coils --.
Line 59, after "is" insert -- a --.

<u>Column 10,</u>
Line 33, change "Eddy" to -- eddy --.

<u>Column 11,</u>
Line 10, change "is" to -- are --

<u>Column 12,</u>
Line 50, change "then" to -- than --.

<u>Column 13,</u>
Line 28, change "above, can" to -- above can --.
Line 35, change "VELCRO" to -- VELCRO$^{TM}$ --.

<u>Column 16,</u>
Line 9, after "further" insert -- embodiment --.

UNITED STATES PATENT AND TRADEMARK OFFICE
CERTIFICATE OF CORRECTION

PATENT NO. : 6,229,310 B1
DATED : May 8, 2001
INVENTOR(S) : Green et al.

It is certified that error appears in the above-identified patent and that said Letters Patent is hereby corrected as shown below:

Column 18,
Line 4, change $H_R I_R H_D I_D$" to -- $H_R \propto I_R\ H_D \propto I_D$ --.

Column 21,
Line 56, change "includes" to -- include --.

Column 22,
Line 16, delete the second occurrence of "resonant".
Line 27, after "claim 23" insert -- wherein --.

Signed and Sealed this

Nineteenth Day of February, 2002

Attest:

*Attesting Officer*

JAMES E. ROGAN
*Director of the United States Patent and Trademark Office*